United States Patent
Edwards et al.

(10) Patent No.: US 11,209,394 B2
(45) Date of Patent: Dec. 28, 2021

(54) CARTRIDGES FOR INTEGRATED BAW BIOSENSORS AND METHODS FOR USING THE SAME

(71) Applicant: QORVO US, INC., Greensboro, NC (US)

(72) Inventors: Thayne L. Edwards, Bend, OR (US); Florian Bell, Bend, OR (US); Matthew Ryder, Bend, OR (US); Bruce Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 247 days.

(21) Appl. No.: 16/319,410

(22) PCT Filed: Jul. 26, 2017

(86) PCT No.: PCT/US2017/043992
§ 371 (c)(1),
(2) Date: Jan. 21, 2019

(87) PCT Pub. No.: WO2018/022778
PCT Pub. Date: Feb. 1, 2018

(65) Prior Publication Data
US 2019/0234907 A1 Aug. 1, 2019

Related U.S. Application Data
(60) Provisional application No. 62/370,788, filed on Aug. 4, 2016, provisional application No. 62/368,261, filed (Continued)

(51) Int. Cl.
*G01N 29/02* (2006.01)
*G01N 29/036* (2006.01)
(Continued)

(52) U.S. Cl.
CPC ........ *G01N 29/022* (2013.01); *B01L 3/50273* (2013.01); *B01L 3/502715* (2013.01);
(Continued)

(58) Field of Classification Search
CPC .. G01N 29/022; G01N 29/036; G01N 29/222; G01N 29/2437; G01N 2291/014;
(Continued)

(56) References Cited

U.S. PATENT DOCUMENTS
| | | |
|---|---|---|
| 4,640,756 A | 2/1987 | Wang et al. |
| 5,173,956 A | 12/1992 | Hayes |

(Continued)

FOREIGN PATENT DOCUMENTS
| | | |
|---|---|---|
| WO | 2008/088289 | 7/2008 |
| WO | 2018/022757 | 2/2018 |

OTHER PUBLICATIONS

Milne, et al., "ZnO Based SAW and FBAR devices for Lab-on-a chip Applications", 2011, Proceedings of the International Display Workshops, 2, 1149-1152. (Year: 2011).*

(Continued)

*Primary Examiner* — Jill A Warden
*Assistant Examiner* — Henry H Nguyen
(74) *Attorney, Agent, or Firm* — Mueting Raasch Group

(57) ABSTRACT

A cartridge for sample handling and sensing includes (i) a sample port; (ii) a first fluid port connected to the sample reservoir in the distal region via a first fluid channel; and (iii) a second fluid port connected to the sample reservoir via a second fluid channel. The cartridge includes (i) a sensor platform comprising a bulk acoustic wave (BAW) resonator and a fluid flow path comprising a sensing region extending across a sensing surface of the BAW resonator; and (ii) a fluid valve between the sample reservoir and the sensing region. A sample may be applied to the sample port; first
(Continued)

volume of fluid may be injected through the first fluid port; and then a second volume of fluid may be injected through the second fluid port to drive the sample into the sensing region of the fluid flow path.

20 Claims, 6 Drawing Sheets

Related U.S. Application Data on Jul. 29, 2016, provisional application No. 62/366,831, filed on Jul. 26, 2016.

(51) Int. Cl.
| | |
|---|---|
| *G01N 29/22* | (2006.01) |
| *G01N 29/24* | (2006.01) |
| *G01N 29/32* | (2006.01) |
| *B01L 3/00* | (2006.01) |
| *H03H 9/17* | (2006.01) |

(52) U.S. Cl.
CPC ........ *B01L 3/502738* (2013.01); *G01N 29/02* (2013.01); *G01N 29/036* (2013.01); *G01N 29/22* (2013.01); *G01N 29/222* (2013.01); *G01N 29/2437* (2013.01); *G01N 29/32* (2013.01); *H03H 9/175* (2013.01); *B01L 2300/0636* (2013.01); *B01L 2300/0816* (2013.01); *B01L 2300/0867* (2013.01); *B01L 2300/165* (2013.01); *B01L 2400/0688* (2013.01); *B01L 2400/088* (2013.01); *G01N 2291/014* (2013.01); *G01N 2291/022* (2013.01); *G01N 2291/0255* (2013.01); *G01N 2291/0256* (2013.01); *G01N 2291/0426* (2013.01); *G01N 2291/106* (2013.01)

(58) Field of Classification Search
CPC ..... G01N 2291/022; G01N 2291/0256; G01N 2291/0426; G01N 2291/106; G01N 29/22; G01N 29/02; G01N 29/32; G01N 2291/0255; B01L 3/50273; B01L 3/502715; B01L 3/502738; B01L 2300/165; B01L 2300/0636; B01L 2300/0816; B01L 2300/0867; B01L 2400/0688; B01L 2400/088; H03H 9/175
See application file for complete search history.

(56) References Cited

U.S. PATENT DOCUMENTS

| | | | |
|---|---|---|---|
| 5,616,872 A | 4/1997 | O'Brien | |
| 6,294,063 B1 | 9/2001 | Becker et al. | |
| 6,858,185 B1* | 2/2005 | Kopf-Sill | B01L 3/5027 422/504 |
| 6,881,314 B1 | 4/2005 | Wang et al. | |
| 6,955,787 B1 | 10/2005 | Hanson | |
| 8,586,351 B2 | 11/2013 | Villa et al. | |
| 9,791,412 B2 | 10/2017 | Kukita et al. | |
| 9,821,310 B2 | 11/2017 | Guldiken et al. | |
| 2002/0051971 A1* | 5/2002 | Stuelpnagel | B01J 19/0046 435/6.11 |
| 2005/0240110 A1 | 10/2005 | Liu et al. | |
| 2006/0034346 A1 | 2/2006 | Saio et al. | |
| 2006/0051010 A1 | 3/2006 | Chu et al. | |
| 2006/0172409 A1 | 8/2006 | Shinohara et al. | |
| 2006/0216812 A1 | 9/2006 | Okada et al. | |
| 2006/0243064 A1 | 11/2006 | Liu et al. | |
| 2007/0052327 A1 | 3/2007 | Vilander | |
| 2008/0054382 A1 | 3/2008 | Stetter | |
| 2009/0110605 A1* | 4/2009 | Kido | B01L 3/5027 422/400 |
| 2010/0134209 A1 | 6/2010 | Gabl | |
| 2010/0163410 A1 | 7/2010 | Villa et al. | |
| 2010/0247021 A1 | 9/2010 | Cunningham et al. | |
| 2011/0023581 A1* | 2/2011 | Chou | G01N 30/88 73/23.42 |
| 2012/0040470 A1 | 2/2012 | Dorn et al. | |
| 2012/0118736 A1 | 5/2012 | Fan et al. | |
| 2012/0164753 A1 | 6/2012 | Johnston et al. | |
| 2012/0196280 A1* | 8/2012 | Karlsen | B01L 3/5027 435/6.1 |
| 2014/0008307 A1 | 1/2014 | Guldiken et al. | |
| 2015/0276727 A1 | 10/2015 | Talebpour et al. | |
| 2016/0013771 A1 | 1/2016 | Suresh et al. | |
| 2016/0172775 A1 | 6/2016 | Tischer et al. | |
| 2016/0238457 A1 | 8/2016 | Leighton, II | |
| 2019/0329255 A1 | 10/2019 | Edwards | |

OTHER PUBLICATIONS

Alder, J.F., et al., "Temperature Compensation of a Surface Acoustic Wave Sensor Using an Integral Temperature Sensor," Analyst, vol. 114, Sep. 1989, pp. 1163-1165.

Ballantine, D. S., et al. "Temperature Effects and the Need for Temperature Control." Acoustic Wave Sensors, Theory, Design, and Physico-Chemical Applications. San Diego: Academic Press, 1997. 375-378.

Bell et al., U.S. Appl. No. 16/321,712, filed Jan. 29, 2019.

Caldwell, Karin D., et al., "Electrical Field-Flow Fractionation in Particle Separation. 1. Monodisperse Standards," Analytical Chemistry, vol. 65, No. 13, Jul. 1993, pp. 1764-1772.

De Vries, J.W.C., "Temperature and Thickness Dependence of the Resistivity of Thin Polycrystalline Aluminum, Cobalt, Nickel, Palladium, Silver and Gold Films," Thin Solid Films, vol. 167, Nos. 1-2, Dec. 15, 1988, pp. 25-32.

Desai et al., "Electrical Resistivity of Aluminum and Manganese," 1984, J. Phys. Chem. Ref. Data, 13(4):1131-72.

Frey, et al., "Continuous-Flow Multi-Analyte Biosensor Cartridge with Controllable Linear Response Range," Sep. 7, 2010, Lab on a Chip, 10(17):2226-34.

Gale, B.K., et al., "A Micromachined Electrical Field-Flow Fractionation (μ EFFF) System," IEEE Transactions on Biomedical Engineering, vol. 45, No. 12, Dec. 1998, pp. 1459-1469.

International Patent Application No. PCT/US2017/043958, filed Jul. 26, 2017; International Search Report / Written Opinion dated Oct. 6, 2017; 11 pages.

International Patent Application No. PCT/US2017/043992, filed Jul. 26, 2017; International Search Report / Written Opinion dated Oct. 6, 2017; 9 pages.

Panta et al., "Electrical Characterization of Aluminum (Al) Thin Films Measured by Using Four-Point Probe Method," Dec. 2012, Kathmandu University Journal of Science, 8(2):31-36.

Scuor et al., "Modeling of a Microfluidic Channel in the Presence of an Electrostatic Induced Cross-Flow", Biomedical Microdevices, vol. 7, No. 3, Sep. 15, 2005, pp. 231-242.

Yang, Zhiyong, et al., Opto-electrophoretic Detection of Biomolecules Using Conducting Chalcogenide Glass Sensors, Optics Express, vol. 18, No. 25, Dec. 6, 2010, pp. 26754-26759.

\* cited by examiner

CARTRIDGES FOR INTEGRATED BAW BIOSENSORS AND METHODS FOR USING THE SAME

RELATED APPLICATIONS

This application is the § 371 U.S. National Stage of International Application No. PCT/US2017/043992, filed 26 Jul. 2017, which claims priority to U.S. Provisional Application Ser. No. 62/366,831, filed on 26 Jul. 2016; to U.S. Provisional Application Ser. No. 62/368,261, filed on 29 Jul. 2016; and to U.S. Provisional Application Ser. No. 62/370,788, filed on 4 Aug. 2016, the contents of which are hereby incorporated herein their entireties to the extent that they do not conflict with the disclosure presented herein.

FIELD

The present disclosure relates to bulk acoustic wave (BAW) resonators and their use as biosensors. In particular, the present disclosure relates to cartridges containing bulk acoustic wave resonators.

BACKGROUND

Numerous instruments and measurement techniques exist for diagnostic testing of materials for medical, veterinary medical, environmental, biohazard, bioterrorism, agricultural, and food safety purposes. Diagnostic testing traditionally requires long response times to obtain meaningful data, involves expensive, remote, or cumbersome laboratory equipment, requires large sample size, utilizes multiple reagents, demands highly trained users, and can involve significant direct and indirect costs. For example, in both the human and veterinary diagnostic markets, most tests require that a sample be collected from a patient and then be sent to a laboratory, where the results are not available for several hours or days. As a result, the caregiver must wait to treat the patient.

Point of use (or point of care when discussing human or veterinary medicine) solutions for diagnostic testing and analysis, although capable of solving most of the noted drawbacks, remain somewhat limited. Even some of the point of use solutions that are available, are limited in sensitivity and reproducibility compared to in-laboratory testing. There are also often significant costs involved as separate systems may be needed for different point of use tests.

Bulk acoustic wave (BAW) sensors have been described for use as biosensors. Fluidic devices having BAW sensors for detecting the presence of an analyte in a sample often have biomolecules, such as antibodies or other proteins such as receptors, polynucleic acids, or the like, attached to their surfaces. The analyte may bind to the biomolecule attached to the surface of the sensor and increase the mass bound to the sensor. The increased mass alters the wave propagation characteristics (e.g., magnitude, frequency, phase, etc.) of the sensor. The change in propagation characteristics due to analyte binding may be correlated with the amount of bound analyte and, thus, the amount of analyte in the sample.

It would be desirable to provide a biosensor platform for point of use testing that is simple and cost-effective to manufacture, allows for flexibility to test for various analytes on the same platform, and is convenient and reliable.

SUMMARY

Disclosed herein are cartridges containing BAW resonators as sensors. The cartridges are designed to flow sample across sensing surfaces of the resonators. The cartridges provide for effective manipulation of flow of fluid through the cartridge to cause a sample to flow of a sample across sensing surfaces of the resonators.

The cartridges may be used with external devices, such as readers, that may fluidly connect with the cartridges to manipulate flow of the sample through the cartridge, precondition a flow path for sample flow, and the like.

In one aspect, a cartridge for handling and sensing a liquid sample is disclosed herein. The cartridge includes a sensor comprising a bulk acoustic wave (BAW) resonator having a sensing surface; a sample port; and a fluid flow path from the sample port to the sensor for carrying a sample introduced into the sample port across the sensing surface of the resonator. The fluid flow path includes a sample reservoir defining a proximal portion of the fluid flow path and defining an inner surface. The sample reservoir has a proximal end connected to the sample port, a proximal region adjacent the proximal end, a distal end, a distal region adjacent the distal end, and a volume extending between the proximal end and the distal end. The fluid flow path further includes a sensing portion downstream of the sample reservoir and extending across the sensing surface of the resonator. The sensing surface of the resonator defines at least a portion of a surface of the sensing portion. The flow path further comprises a valve disposed between the distal end of the sample reservoir and the sensing portion. The cartridge also includes a first fluid port, a first fluid channel, a second fluid port, and a second fluid channel. The first fluid channel has a proximal end connected to the first fluid port and a distal end connected to the distal region of the sample reservoir. The second fluid channel has a proximal end connected to the second fluid port and a distal end connected to the proximal region of the sample reservoir.

In another aspect, a method of sample handling and sensing using a cartridge is disclosed. The cartridge includes a sample port connected to a sample reservoir having a proximal end, a proximal region adjacent the proximal end, and a distal end opposite of the proximal end. The cartridge also includes a first fluid port connected to the sample reservoir in the distal region via a first fluid channel; and a second fluid port connected to the sample reservoir in the proximal region via a second fluid channel. In addition, the cartridge includes a sensor platform comprising a bulk acoustic wave (BAW) resonator and a fluid flow path comprising a sensing region extending across a sensing surface of the BAW resonator. The cartridge further includes a fluid valve between the distal end of the sample reservoir and the sensing region. The method includes applying a sample to the sample port; injecting a first volume of fluid through the first fluid port; and then injecting a second volume of fluid through the second fluid port to drive the sample into the sensing region of the fluid flow path.

BRIEF DESCRIPTION OF DRAWINGS

The drawings are not necessarily to scale. Like numbers used in the figures refer to like parts. However, the use of different numbers to refer to components is not intended to indicate that the different numbered components cannot be the same or similar.

DETAILED DESCRIPTION

In the following detailed description, several specific embodiments of compounds, compositions, products and methods are disclosed. It is to be understood that other embodiments are contemplated and may be made without departing from the scope or spirit of the present disclosure. The following detailed description, therefore, is not to be taken in a limiting sense.

The present disclosure relates to bulk acoustic wave (BAW) resonators and their use as biosensors. In particular, the present disclosure relates to devices, such as cartridges, containing bulk acoustic wave resonators.

Figure 1:
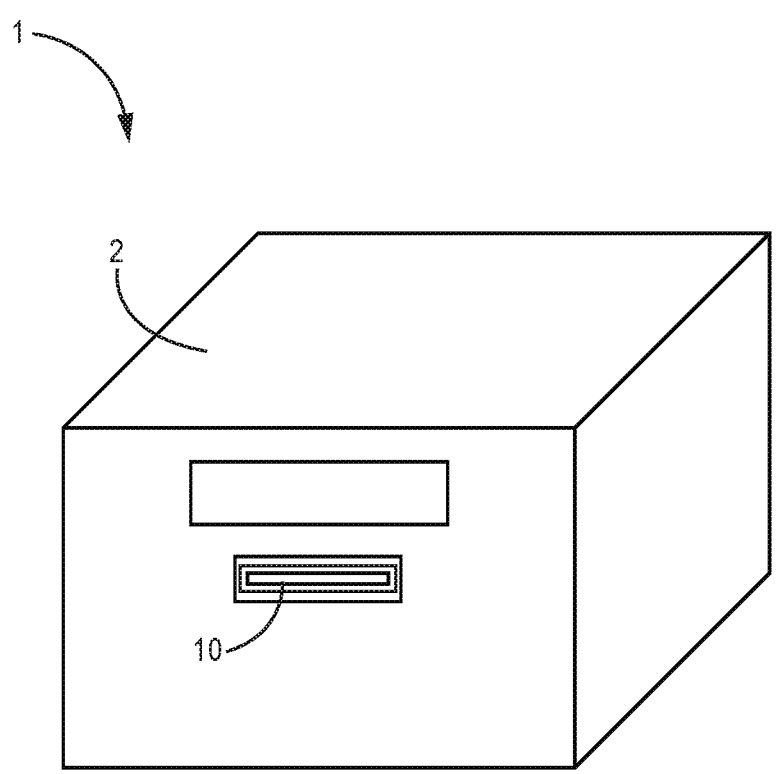
FIG. 1 is a schematic perspective view of a system according to an embodiment.

As shown schematically in FIG. 1, the cartridge 10 may be used as part of a system 1 with a device or reader 2 constructed to receive the cartridge 10. The reader 2 may provide solutions used in sample handling in the cartridge 10, and may be used to read and optionally interpret the results from the BAW sensor in the cartridge 10.

The cartridge 10 of the present disclosure embodies the integrated components necessary to convert a BAW resonator, or array of BAW resonators, into a biosensor. This allows for a collection of the tools integrated into a single cartridge that can be tailored for the detection of one or more analytes, such as proteins, DNA, bacteria, fungi, viruses, and other biological or non-biological materials.

The disclosed cartridges can accommodate a large breadth of testing protocols without requiring the platform to be entirely redesigned. The disclosed cartridges may also provide for the use of the same configuration for different protocols, meaning that only the materials would need to be different to afford different protocols to be undertaken with the device. The cartridges may be manufactured with a selectable or interchangeable sensor platform that allows for even more flexibility. The cartridges or parts of the cartridges may be reusable, recyclable, or disposable. The cartridges may be offered as "dry" cartridges, meaning that no liquid reagents are stored on the device, making the cartridges simpler and more cost-effective to manufacture, and improving storage life of the device. The cartridges are portable and can be used at the sampling location or transported into a laboratory or other secondary site for analysis.

The cartridges of the present disclosure are constructed to receive a liquid sample, to at least temporarily store the sample, to provide sample handling and conditioning, and to transfer and meter the sample to a sensor for analysis of one more parameters of the sample. Examples of typical samples include biological samples, such as urine, plasma, serum, blood, saliva, tears, sweat, and the like, and environmental samples, such as air or other gases, water, and aqueous solutions. However, the device can be modified to accommodate various types of fluid samples, and is not particularly limited by sample type.

The cartridges of the present disclosure utilize sensors with bulk acoustic wave (BAW) resonators. According to an embodiment, the cartridge contains a BAW array in a fluid flow path. BAW resonators generally include a piezoelectric crystal resonator that can be used to detect changes in material (e.g., changes in the mass of the material) deposited (e.g., bound) on the surface of the resonator. The BAW resonator may have biomolecules, such as antibodies or other proteins such as receptors, polynucleic acids, or the like, attached to its surface such that when the target analyte passes over the surface, it binds onto the biomolecule. The cartridge may be prepared with various select biomolecules based on the desired target analyte or analytes.

BAW devices typically involve transduction of an acoustic wave using electrodes arranged on opposing top and bottom surfaces of a piezoelectric material. In a BAW device, three wave modes may propagate, namely, one longitudinal mode (embodying longitudinal waves, also called compressional/extensional waves), and two shear modes (embodying shear waves, also called transverse waves), with longitudinal and shear modes respectively identifying vibrations where particle motion is parallel to or perpendicular to the direction of wave propagation. The longitudinal mode is characterized by compression and elongation in the direction of the propagation, whereas the shear modes consist of motion perpendicular to the direction of propagation with no local change of volume. Longitudinal and shear modes propagate at different velocities. In practice, these modes are not necessarily pure modes as the particle vibration, or polarization, is neither purely parallel nor purely perpendicular to the propagation direction. The propagation characteristics of the respective modes depend on the material properties and propagation direction respective to the crystal axis orientations. The ability to create shear displacements is beneficial for operation of acoustic wave devices with fluids (e.g., liquids) because shear waves do not impart significant energy into fluids. BAW devices include bulk acoustic resonators deposited on one or more reflective layers, such as Bragg mirror, and film bulk acoustic resonators having an air-gap.

The BAW sensor described herein may employ any suitable piezoelectric thin film. Certain piezoelectric thin films are capable of exciting both longitudinal and shear mode resonance, such as hexagonal crystal structure piezoelectric materials including (but not limited to) aluminum nitride (AlN) and zinc oxide (ZnO). To excite a wave including a shear mode using a piezoelectric material layer arranged between electrodes, a polarization axis in a piezoelectric thin film is generally non-perpendicular to (e.g., tilted relative to) the film plane. In sensing applications involving liquid media, the shear component of the resonator is preferably used. In such applications, piezoelectric material may be grown with a c-axis orientation distribution that is non-perpendicular relative to a face of an underlying substrate to enable a BAW resonator structure to exhibit a dominant shear response upon application of an alternating current signal across electrodes thereof. Conversely, a piezoelectric material grown with a c-axis orientation that is perpendicular relative to a face of an underlying substrate will exhibit a dominant longitudinal response upon application of an alternating current signal across electrodes thereof.

Figure 2A:
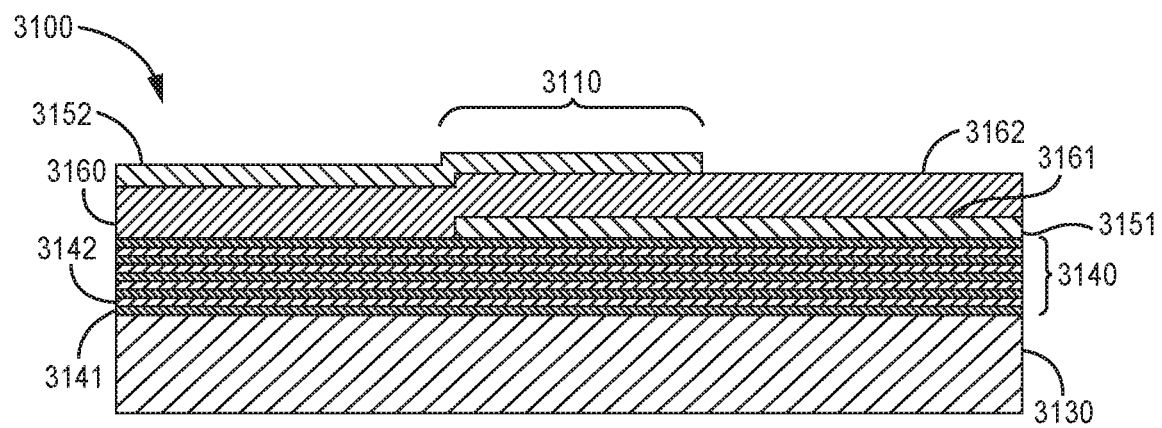
FIGS. 2A and 2B are schematic cross-sectional views of bulk acoustic wave resonators.

FIG. 2A is a schematic cross-sectional view of a portion of a bulk acoustic wave (BAW) Microelectromechanical system (MEMS) resonator structure 3100 useable with embodiments disclosed herein. The resonator structure 3100 includes a substrate 3130 (e.g., typically silicon or another semiconductor material), an acoustic reflector 3140 arranged over the substrate 3130, a piezoelectric material 3160, and bottom and top side electrodes 3151, 3152. The bottom side electrode 3151 is arranged along a portion of a lower surface

3161 of the piezoelectric material 3160 (between the acoustic reflector 3140 and the piezoelectric material 3160), and the top side electrode 3152 is arranged along a portion of an upper surface 3162 of the piezoelectric material 3160. An area in which the piezoelectric material 3160 is arranged between overlapping portions of the top side electrode 3152 and the bottom side electrode 3151 is considered an active region 3110 of the resonator device 3100 to which a biomolecule is preferably applied. The acoustic reflector 3140 serves to reflect acoustic waves and therefore reduce or avoid their dissipation in the substrate 3130. In certain embodiments, the acoustic reflector 3140 includes alternating thin layers 3141, 3142 of materials (e.g., silicon oxicarbide [SiOC], silicon nitride [$Si_3N_4$], silicon dioxide [$SiO_2$], aluminum nitride [AlN], tungsten [W], and molybdenum [Mo]) having different acoustic impedance values, optionally embodied in a quarter-wave Bragg mirror, deposited over the substrate 3130. In certain embodiments, other types of acoustic reflectors may be used. Steps for forming the resonator device 30 may include depositing the acoustic reflector 3140 over the substrate 3130, followed by deposition of the bottom side electrode 3151, followed by growth (e.g., via sputtering or other appropriate methods) of the piezoelectric material 3160, followed by deposition of the top side electrode 3152.

In certain embodiments, the piezoelectric material 3160 comprises a hexagonal crystal structure piezoelectric material (e.g., aluminum nitride or zinc oxide) that includes a c-axis having an orientation distribution that is predominantly non-parallel (and may also be non-perpendicular to) to normal of a face of the substrate 3130. Under appropriate conditions, presence of a c-axis having an orientation distribution that is predominantly non-parallel to normal of a face of a substrate enables a BAW resonator structure to be configured to exhibit a dominant shear response upon application of an alternating current signal across a distal electrode and a proximal electrode thereof (e.g., as may be desirable in the context of a BAW resonator structure providing sensing utility). Methods for forming hexagonal crystal structure piezoelectric materials including a c-axis having an orientation distribution that is predominantly non-parallel to normal of a face of a substrate are disclosed in U.S. patent application Ser. No. 15/293,063 filed on Oct. 13, 2016. Additional methods for forming piezoelectric materials having an inclined c-axis orientation are disclosed in U.S. Pat. No. 4,640,756 issued on Feb. 3, 1987.

The bulk acoustic wave MEMS resonator structure 3100 shown in FIG. 2A lacks any layers (e.g., including functionalization material) overlying the active region 3110 that maypermit the resonator device 3100 to be used as a biochemical sensor. If desired, at least portions of the resonator device 3100 shown in FIG. 2A (e.g., including the active region 3110) may be overlaid with various layers, such as one or more of: a hermeticity layer, an interface layer, a self-assembled monolayer (SAM), and/or a functionalization material layer (which may include specific binding material or non-specific binding material).

Figure 2B:
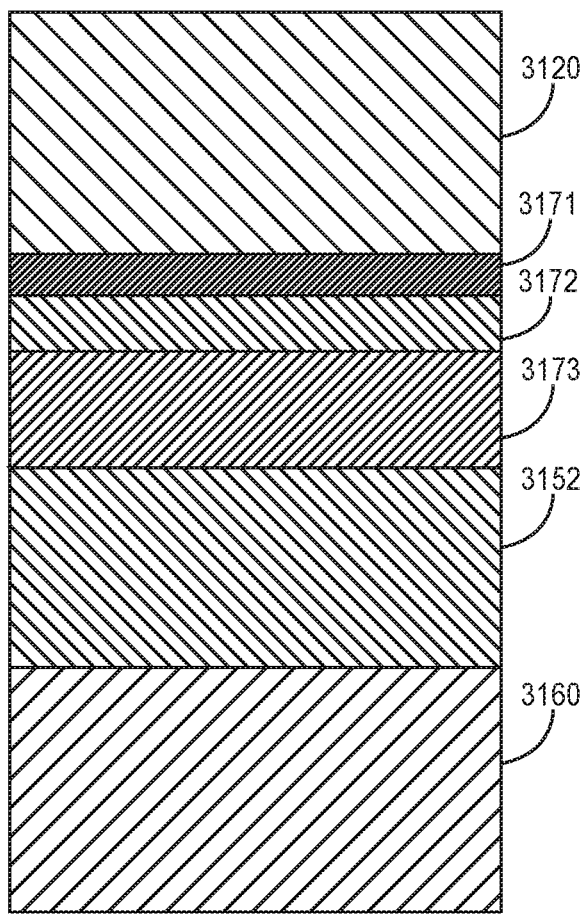

FIG. 2B is a schematic cross-sectional view of an upper portion of a BAW resonator device including a piezoelectric material 3160 and a top side electrode 3152 overlaid with a hermeticity layer 3171, an interface layer 3172, a self-assembled monolayer (SAM) 3173, and a layer 3120 comprising a biomolecule. In certain embodiments, one or more blocking materials (not shown) may be applied during fabrication, such as over portions of an interface layer to prevent localized attachment of one or more subsequently deposited layers, or (if applied over selected regions of a SAM or a functionalization material) to prevent analyte capture in regions not overlying an active region of the BAW resonator device.

In certain embodiments incorporating electrode materials subject to corrosion, a hermeticity layer may be applied between a top side electrode and an interface layer. If provided, a hermeticity layer preferably includes a dielectric material with a low water vapor transmission rate (e.g., no greater than 0.1 $g/m^2$/day). Following deposition of a hermeticity layer and an interface layer, a SAM may be formed over the interface layer, with the SAM including an organosilane material in certain embodiments. The hermeticity layer protects a reactive electrode material (e.g., aluminum or aluminum alloy) from attack in corrosive liquid environments, and the interface layer facilitates proper chemical binding of the SAM.

Following deposition of an interface layer (optionally arranged over an underlying hermeticity layer), a SAM is preferably formed over the interface layer. SAMs are typically formed by exposure of a solid surface to amphiphilic molecules with chemical groups that exhibit strong affinities for the solid surface. When an interface layer comprising a hydroxylated oxide surface is used, then organosilane SAMs are particularly preferred for attachment to the hydroxylated oxide surface. Organosilane SAMs promote surface bonding through silicon-oxygen (Si—O) bonds.

When an electrode and/or interface layer comprising gold or another noble metal is used, then thiol-based (e.g., alkanethiol-based) SAMs may be used. Alkanethiols are molecules with an alkyl chain as the back bone, a tail group, and an S—H head group. Thiols may be used on noble metal interface layers due to the strong affinity of sulfur for these metals.

Following formation of a SAM, the SAM may be biologically functionalized, such as by receiving at least one specific binding material. In certain embodiments, specific binding materials may be applied on or over a SAM using a microarray spotting needle or other suitable methods. In certain embodiments, an interface layer may be patterned (e.g., using photolithography for defining the interface layer) with a high dimensional tolerance over only a portion of a resonator structure (which includes a substrate), a SAM may be applied over the interface layer, and a subsequently applied specific binding material may be attached only to the SAM. In certain embodiments, patterning of an interface layer may provide a higher dimensional tolerance for positioning of the specific binding material than could be attained by microarray spotting alone. Examples of specific binding materials include, but are not limited to, antibodies, receptors, ligands, oligopeptides, DNA or RNA strands, and the like. A specific binding material is preferably configured to receive a predefined target species (e.g., molecule, protein, DNA, virus, bacteria, etc.). A functionalization material including specific binding material may include a thickness in a range of from about 5 nm to about 1000 nm, or from about 5 nm to about 500 nm. In certain embodiments, an array of different specific binding materials may be provided over different active areas of a multi-resonator structure (i.e., one or more resonator structures including multiple active regions), optionally in combination with one or more active areas that are devoid of specific binding materials to serve as comparison (or "reference") regions. In certain embodiments, a functionalization material (e.g., chemical functionalization material) may provide non-specific binding utility.

Certain embodiments of the present disclosure are directed to a cartridge including multiple BAW resonators as disclosed herein and including a fluidic passage (e.g., a channel, a chamber, or the like) arranged to conduct a liquid to contact at least one functionalization (e.g., specific binding) material arranged over at least one active sensing surface of the resonators. Such a device may be microfluidic in scale, and comprise at least one microfluidic passage (e.g., having at least one dimension, such as height and/or width, of no greater than about 1000 microns, no greater than about 500 microns, or no greater than about 250 microns, or no greater than about 100 microns).

Figure 3:
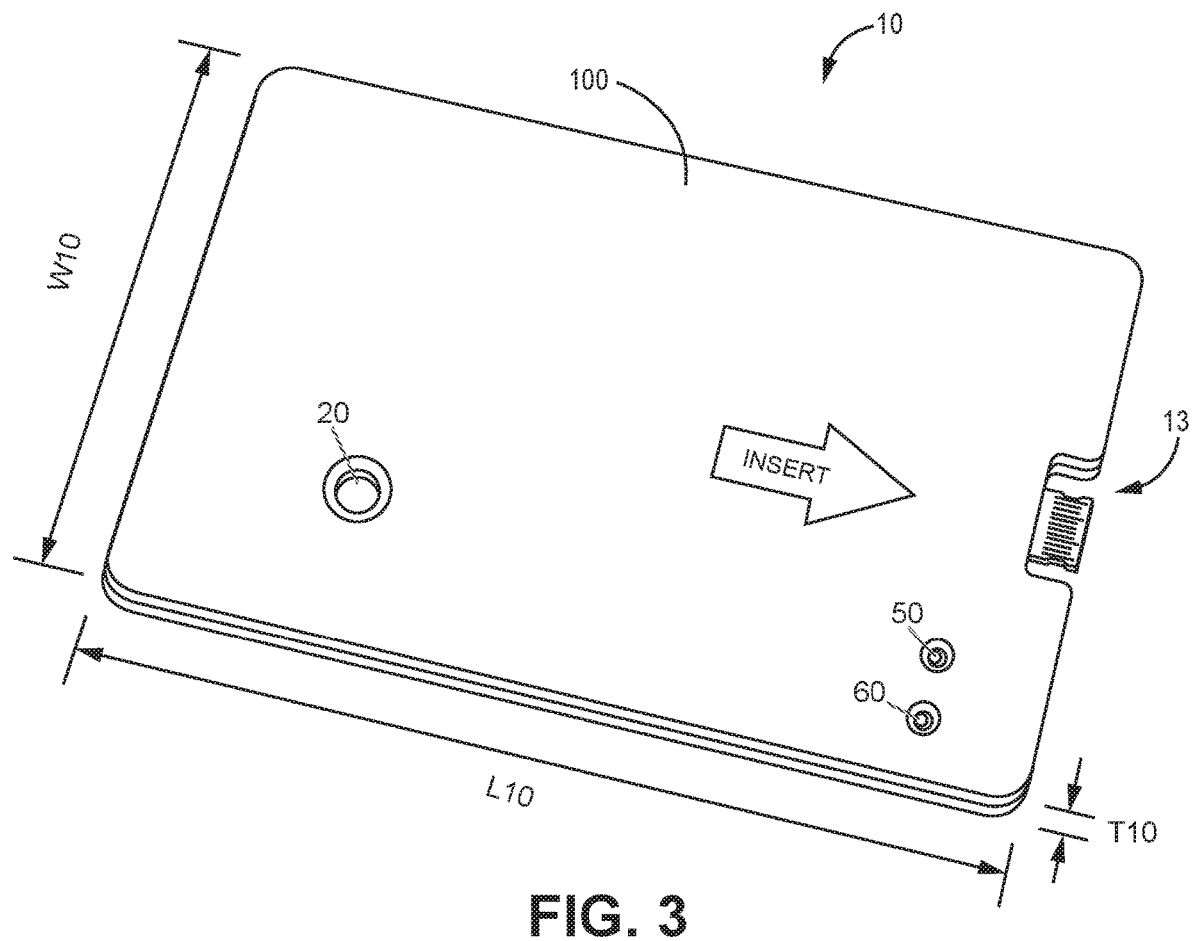
FIG. 3 is a perspective view of a cartridge according to an embodiment.

Referring now to FIG. 3, a cartridge 10 housing a BAW resonator sensor 30 is shown. According to an embodiment, the cartridge 10 contains a fluid flow path 40 with a sample port 20 that is constructed to guide the sample across the sensing surface of a BAW array 320 arranged in the fluid flow path 40. The fluid flow path 40, the BAW sensor 30, and other parts discussed in more detail below, are housed in a cartridge housing 100. The shape and size of the cartridge housing 100 is not particularly limited, and the cartridge 10 may have any suitable shape and size. In the embodiment shown, the cartridge 10 has a width W10 and length L10 approximately similar to those of a standard size credit card (e.g., about 50 to 60 mm wide and 80 to 90 mm long), and a thickness T10 of about 5-7 mm. The cartridge includes a sample port 20, a first fluid port 50, a second fluid port 60, and an electrical interconnect 13. The first 50 and second 60 fluid ports and the electrical interconnect 13 may interface and operably couple with a reader (such as reader 2 depicted in FIG. 1) or another suitable device.

The description provided above regarding BAW resonators is fairly generic regarding a resonator structure. Some of the description provided with regard to FIGS. 2A and 2B details embodiments of bulk acoustic resonators that may be employed as a resonator structure. In at least some embodiments, the resonator structure incorporated in the cartridge 10 comprises a BAW resonator arranged over at least a portion of a substrate, and a biomolecule arranged over at least a portion of an active region of the BAW resonator structure. Various layers may be arranged between the biomolecule and a top side electrode (which is coincident with an active region of a BAW resonator structure), such as: a hermeticity layer (e.g., to protect the top side electrode from corrosion in a liquid environment), an interface layer, and/or a self-assembled monolayer (SAM), with the interface layer and/or the SAM being useful to facilitate attachment of at least one overlying material layer, ultimately including functionalization material. In certain embodiments, the interface layer facilitates attachment of an overlying SAM, and the SAM facilitates attachment of an overlying functionalization material.

Figure 4:
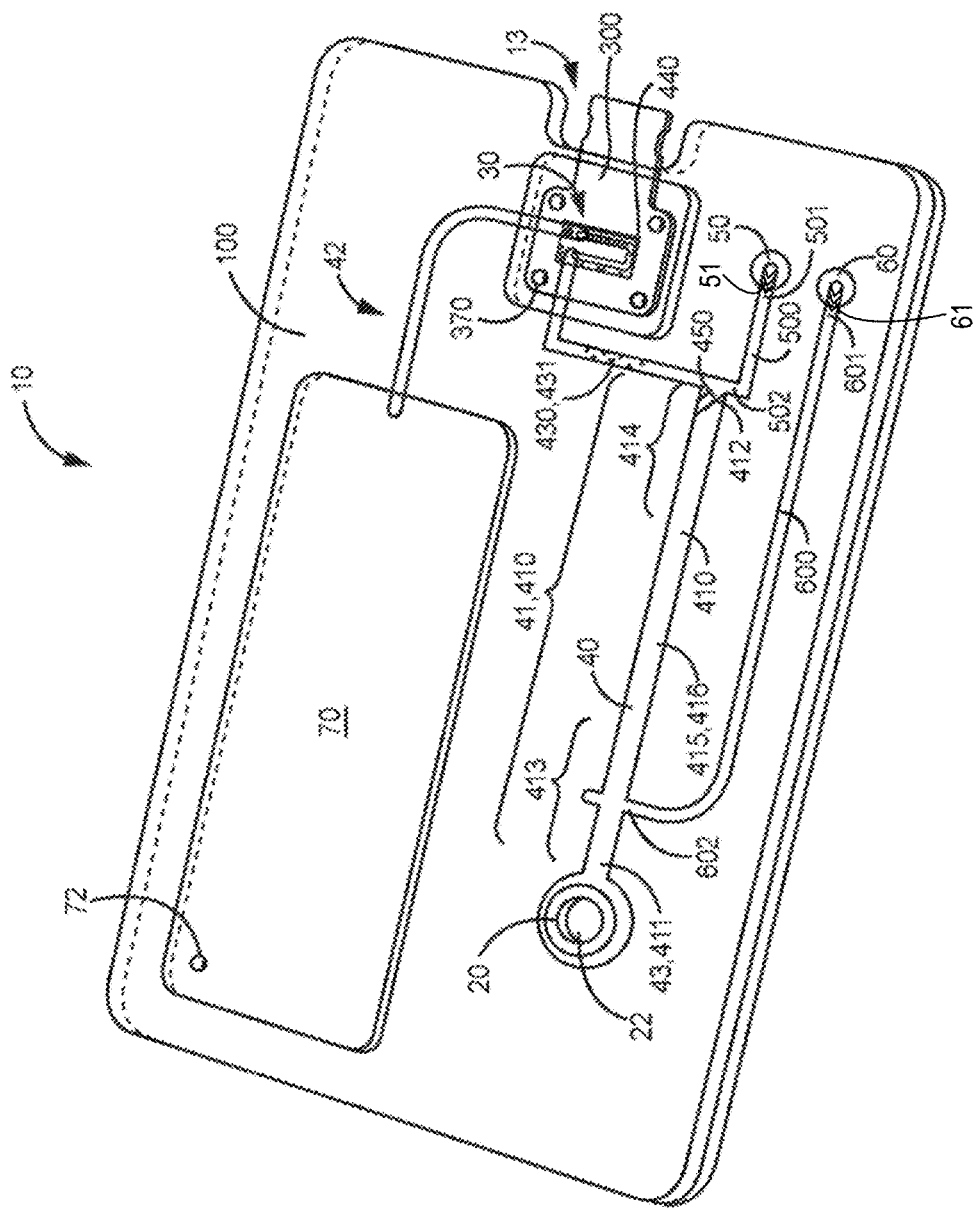
FIG. 4 is a perspective view of the cartridge of FIG. 3 with its cover removed.

FIG. 4 shows a view of the fluid flow path 40 and sensor platform 300 (BAW sensor 30) with the top layer or cover of the cartridge 10 removed. According to an embodiment, the cartridge houses a BAW sensor 30 comprising at least one BAW resonator having a sensing surface. The BAW sensor 30 may include an array of BAW resonators. The cartridge also includes a sample port 20 for introducing a liquid sample to the flow path 40. The fluid flow path 40 extends from the sample port 20 to the sensor 30 and carries a sample introduced into the sample port 20 across the sensing surface of the sensor 30.

The fluid flow path 40 includes a proximal portion 41 and a distal portion 42, and a sample reservoir 410 defining the proximal portion 41 of the fluid flow path 40. The sample reservoir 410 has a proximal end 411 connected to the sample port 20, and a distal end 412 opposite of the proximal end 411. A proximal region 413 is disposed adjacent the proximal end 411, and a distal region 414 adjacent the distal end 412. The sample reservoir 410 has a wall 415 defining an inner surface 416 and a volume extending between the proximal end 411 and the distal end 412.

The fluid flow path 40 further includes a sensing portion 440 downstream of the sample reservoir 410. The sensing portion 440 extends across the sensing surface of one or more resonators of the sensor 30 such that the sensing surface 311 defines at least a portion of a surface 441 of the sensing portion 440.

The fluid flow path 40 includes a valve 450 disposed between the distal end 412 of the sample reservoir 400 and the sensing portion 440. Any suitable valve can be used. Preferably, the valve 450 is a passive valve. In one embodiment, the valve 450 is a hydrophobic valve formed by a hydrophobic surface of the fluid flow path 40 in the area where the valve is formed to prevent hydrophilic sample fluid from flowing past the valve 450 at, for example, ambient pressure. Other embodiments of the cartridge 10 may also include additional valves and fluid flow management features, such as pumps.

The valve 450 may be a hydrophobic valve formed by a hydrophobic surface of the fluid flow path 40. For example, the valve 450 may be formed from a hydrophobic material, such as polyether ether ketone (PEEK), polycarbonate, polyurethane, perfluoroalkoxy alkanes (PFA), polytetrafluoroethylene (PTFE), polythermide (PEI), cyclic olefin copolymers, etc., or may be coated by a hydrophobic coating of the fluid flow path 40. Examples of suitable hydrophobic coatings include silanes modified to include a hydrophobic end group (e.g., an aliphatic or fluorinated hydrocarbon), such as long chain alkylsilanes.

According to an embodiment, the cartridge 10 includes a first fluid port 50 and a first fluid channel 500 extending from a proximal end 501 at the first fluid port 50 to a distal end 502. The distal end 502 of the first fluid channel 500 is connected to the distal region 414 of the sample reservoir 410 via valve 450. In one embodiment, the distal end 502 of the first fluid channel 500 is connected to the distal end 412 of the sample reservoir 410.

According to an embodiment, the cartridge 10 includes a second fluid port 60 and a second fluid channel 600 extending from a proximal end 601 at the second fluid port 60 to a distal end 602. The distal end 602 of the second fluid channel 600 is connected to the proximal region 413 of the sample reservoir 400. For example, the distal end 602 of the second fluid channel 600 may be connected to the proximal end 411 of the sample reservoir 410, or downstream of the proximal end 411 by a distance of up to 15%, up to 20%, up to 25%, up to 30%, or up to 40% of the length of the sample reservoir 410.

As sample handling fluids can be provided through the first and second fluid ports 50, 60, the cartridge 10 may be stored and transported "dry" without liquid reagents stored on the cartridge 10 prior to use. In an alternative embodiment, some liquid reagents (e.g., a buffer) may be stored on the cartridge 10 (e.g., in connection with the first fluid channel 500 or second fluid channel 600).

The sample port 20 may be closed by a closure 22. For example, the sample port 20 may be closed by a film, a cap, a septum, or any other suitable closure that can accommodate delivery of the sample into the sample port 20 and keep the sample from inadvertently flowing out of the sample port 20. In an embodiment, the closure 22 comprises a septum or a similar closure that self-closes after being punctured, and the sample can be delivered by a needle and syringe. In an embodiment, the closure 22 comprises a cap that may be removed to introduce the sample into the sample port 20 and reattached after the sample has been introduced.

The sample reservoir 410 is constructed to receive and house the sample and to deliver the sample into the sensing portion 440. In one embodiment, the sample reservoir 410 is defined by walls 415 that have a hydrophilic surface that can draw an aqueous sample into the sample reservoir 410. The walls 415 may be constructed from a hydrophilic material, such as glass or quartz, or may be coated with a hydrophilic coating. For example, the walls 415 may be coated by polyethylene glycol (PEG), ethylene glycol, polyacrylate, polyvinyl pyrrolidone (PVP). If a polymeric material, such as polyacrylate, is used as the hydrophilic coating, the material may be selected to have hydrophilic properties (e.g., hydroxyethylmethacrylate or "HEMA").

The sample reservoir 410 may have any suitable volume. For example, the volume of the sample reservoir 410 may be about 1 µL or greater, about 4 µL or greater, or about 10 µL or greater. The volume may be about 200 µL or less, about 150 µL or less, about 100 µL or less, about 50 µL or less, or about 20 µL or less. The volume is defined by the walls 415 and the proximal end 411 and distal end 412 of the sample reservoir 410 or the proximal end 411 of the reservoir 410 and a proximal end of valve 450. In one embodiment, the sample port 20 and the sample reservoir 410 are designed to receive a liquid sample of about 10 µL.

According to an embodiment, at least two fluid ports (e.g., first and second fluid ports 50, 60) may deliver fluids into the fluid flow path 40 through fluid channels (e.g., first and second fluid channels 500, 600). The fluids can be used, for example, to prepare the fluid flow path for receiving the sample, such as to prepare the walls of the fluid flow path so that the sample does not get absorbed or adsorbed into the walls, to remove any air bubbles, to stop the sample from getting to the sensor prematurely, or to open the hydrophobic valve. The fluids may also be used to push or advance the sample forward in the fluid flow path, to dilute and buffer the sample, and to deliver and mix chemical agents into the sample.

One or both of the first and second fluid ports 50, 60 may include a valve 51, 61. The first and second fluid ports 50, 60 may be constructed to independently connect to external pumps and fluid reservoirs. For example, the fluid ports may be constructed to couple with corresponding valves or fluid ports connected to pumps, fluid lines, and/or fluid reservoirs on a reader (such as reader 2 depicted in FIG. 1) that receives the cartridge 10.

The first fluid channel 500 (e.g., the distal end 502 of the first fluid channel 500) is connected to the distal region 414 of the sample reservoir 410. In one embodiment, the first fluid channel 500 connects to the fluid flow path 40 at the juncture of the sample reservoir 410 and the mixing region 430. Alternatively, the first fluid channel 500 connects to the sample reservoir 410 upstream of its distal end 412. The first fluid channel 500 may also connect to the fluid flow path 40 downstream of the distal end 412 of the sample reservoir 410.

The second fluid channel 600 (e.g., the distal end 602 of the second fluid channel 600) is connected to the proximal region 413 of the sample reservoir 410. The point where the second fluid channel 600 connects to the sample reservoir 410 can vary within the proximal region 413 such that the fluid (e.g., air or an aqueous solution) injected from the second fluid port 60 can push or deliver at least a part of the sample from the sample reservoir 410 into the sensing portion 440 of the fluid flow path 40. In one embodiment, the second fluid channel 600 connects to the sample reservoir 410 at its proximal end 411. The second fluid channel 600 may also connect to the sample reservoir 410 downstream of the proximal end 411. For example, the second fluid channel 600 may connect to the sample reservoir 410 downstream from the proximal end 411 at up to 15%, up to 20%, up to 25%, up to 30%, or up to 40% down the length of the sample reservoir 410.

The second fluid channel 600 or a portion thereof may include hydrophobic walls or a hydrophobic coating to prevent an aqueous sample from entering the second fluid channel 600.

The fluid flow path 40 may further include a mixing region 430 downstream of the sample reservoir 410. A mixing region can be used to mix the sample with one or more of the fluids provided through the first and second fluid ports 50, 60. The mixing region 430 may include one or more static features 431 constructed to induce mixing within the fluid flow path 40. The static mixing features 431 may include, for example, protrusions that narrow the inside diameter of the fluid flow path or multiple tight turns of the fluid flow path. Such static mixing features 431 may induce turbulence in the mixing region 430.

The cartridge 10 may further include a waste reservoir 70. The waste reservoir 70 may be located at the distal end 42 of the fluid flow path 40. The waste reservoir 70 may be constructed to receive the sample and any fluids used to process the sample (e.g., fluids injected through the first and second fluid ports 50, 60) after the sample and the fluids have progressed through the sensing portion 440. The volume of the waste reservoir 70 is not particularly limited and can range from about 100 µL to about 2 mL. The waste reservoir 70 may also include a vent 72 that allows air or gases but not fluids to escape from the waste reservoir 70. The vent 72 may, for example, be covered by a hydrophobic membrane.

According to some embodiments, the BAW sensor 30 is mounted onto a sensor platform 300. The sensor platform 300 may comprise, for example, a printed circuit board. The sensor platform 300 may be inserted into a cavity on the cartridge 10, such that electrical interconnect 13 extends outside the housing 100 of the cartridge 10, and may include features, such as mounting and registration apertures 370 that aid with placement of the sensor platform 300 in the correct location and can be used to secure the sensor platform 300 in place. The registration apertures 370 may couple with corresponding registration posts on the cartridge 10. Alternatively, the sensor platform 300 may include posts, and the cartridge 10 may include corresponding apertures. The sensor platform 300 can be interchangeable such that a sensor platform with a specific, desired sensor can be selected and installed into the cartridge 10 which in turn can be generic and capable of housing various sensor platforms.

Figure 5A:
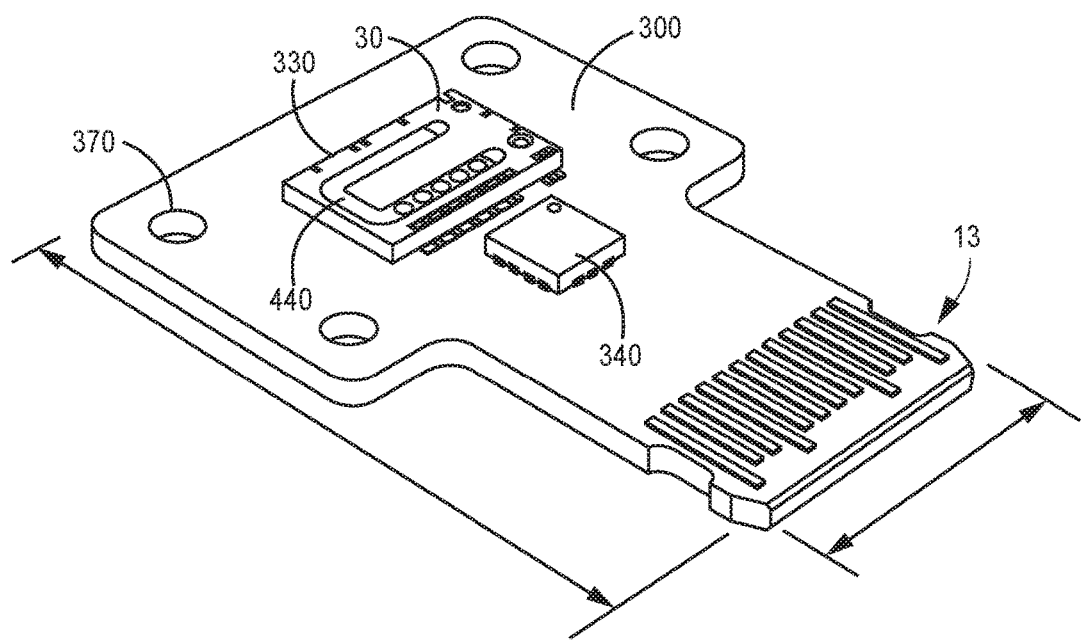
FIG. 5A is a top perspective view of a sensor platform for the cartridge of FIG. 3.
Figure 5B:
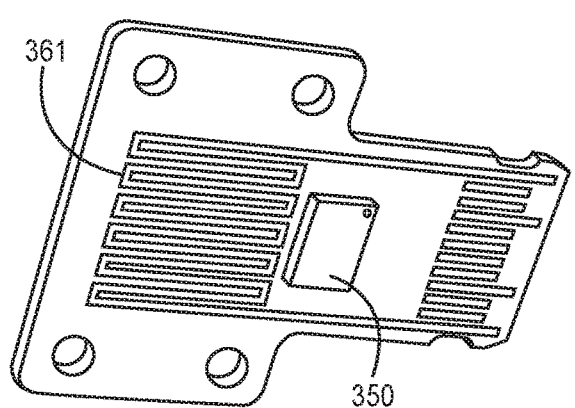
FIG. 5B is a bottom perspective view of the sensor platform of FIG. 5A.
Figure 6:
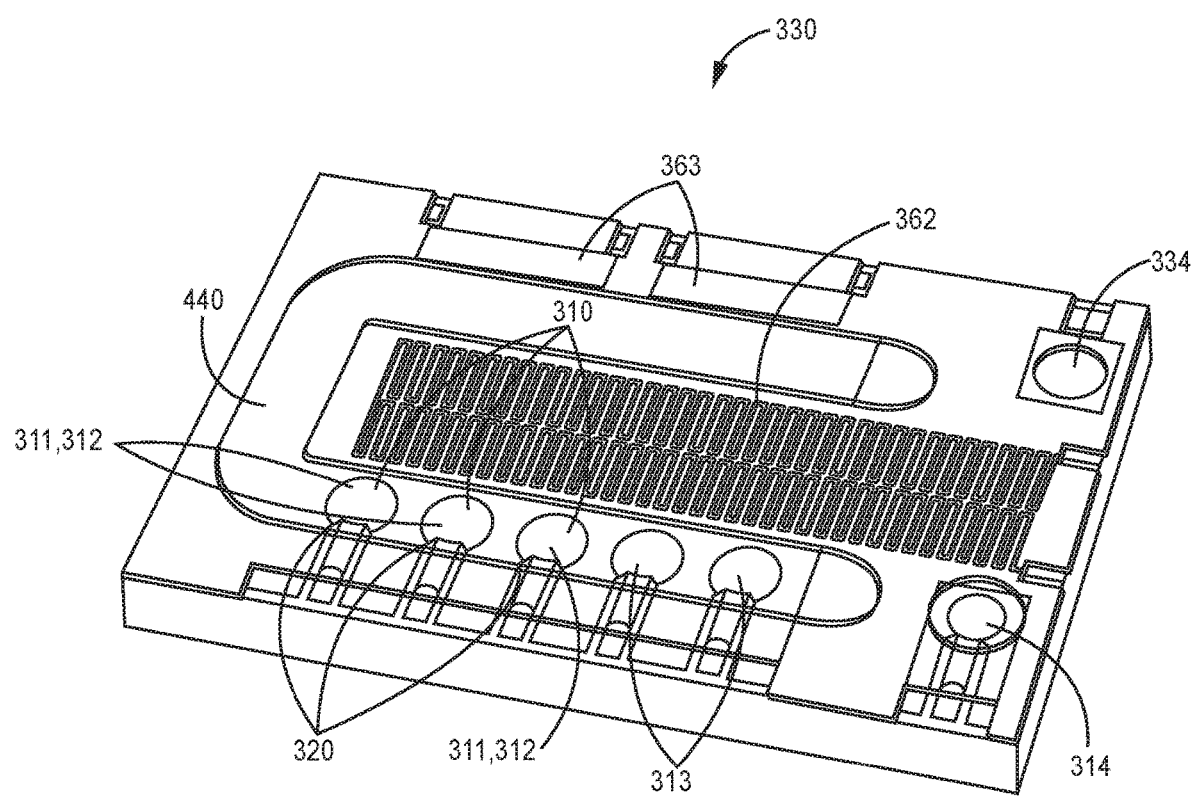
FIG. 6 is a close-up of a sensing region on the sensor platform of FIG. 5A.

Referring now to FIGS. 5A, 5B and 6, the BAW sensor 30 provided on the sensor platform 300 may be provided as a BAW die 330, as shown in FIGS. 5A and 5B. A close-up view of a BAW die 330 is shown in FIG. 6. The sensor platform 300 may also include a RF switch 340 and other circuit components, such as a control and memory unit 350 and other electronic components to stimulate the BAW, condition the signal, and to communicate with the with the various electronics. The electronic component may be operably coupled to electrical interconnect 13 for coupling to an external device, such as a reader.

According to an embodiment, the BAW die 330 defines the sensing portion 440 of the fluid flow path 40. The BAW die 330 includes BAW resonators 310 disposed along the sensing portion 440. The BAW resonators 310 may have a sensing surface 311, where biomolecules 312 are attached to the sensing surface 311. When a sample flows through the sensing portion 440 of the fluid flow path 40, it comes into contact with the BAW resonators 310 and their sensing surfaces 311. The BAW resonators 310 can be arranged in an array that includes multiple BAW resonators 310 of either the same or different types (i.e., including the same or different biomolecules). In the embodiment shown, the BAW array 320 includes six BAW resonators that are divided into three BAW resonators 310 that are used for testing, and three BAW resonators that are used as references (e.g., two non-specific BAW references 313 and an isolated environmental BAW reference 314). However, the sensor is not limited to six BAW resonators, and could include any number, such as from one to 20 resonators. The number of resonators on the sensor 30 can also be divided into testing resonators and reference resonators in various ways and is not limited to the 3-2-1 split of the example cartridge. Typically, the BAW die 330 includes one or more non-specific BAW references 313 and may also include an isolated environmental BAW reference 314. The sensing portion 440 of the fluid flow path 40 may be configured so that the sample (or other fluid) in the fluid flow path 40 does not come into contact with the isolated environmental BAW reference 314. The BAW die 330 also includes an electrical interface 334 for connecting the die to the electrical components of the sample platform 300 and/or a reader through electrical interconnect 13.

Still referring to FIGS. 5A, 5B and 6 and in accordance with an embodiment, a system including a cartridge described herein may include various temperature control mechanisms to help improve precision of the analysis. For example, the system may include multiple stages of temperature control, where one or more stages provide more approximate temperature control and/or insulation, and one or more stages provide finer temperature control. The reader may include a temperature control unit, and may also insulate the cartridge. The housing of the cartridge also provides insulation to the BAW sensor 30 inside the housing. The printed circuit board of the sensor platform 300 may include an electrically resistive heater 361 operated in a closed loop with an integrated resistive temperature device, or resistance temperature detector ("RTD"). The electrically resistive heater 361 may provide temperature control of about ±0.1 K. The BAW die 330 itself may also include a second electrically resistive heater 362 and RTD 363, which may provide temperature control of about ±0.001 K. The second electrically resistive heater 362 may affect temperature of fluid flowing within the sensing portion 440 of the fluid flow path 40. Examples of such temperature control systems are discussed in more detail in co-pending International Patent Application No. PCT/US17/43958, titled BAW BIOSENSOR INCLUDING HEATER AND TEMPERATURE SENSOR AND METHODS FOR USING THE SAME, filed on 26 Jul. 2017, which is incorporated here by reference in its entirety to the extent that it does not conflict with the present disclosure.

The cartridge can be manufactured from any suitable materials, such as polymeric materials, metals, semimetals, semiconductors, ceramics, and combinations thereof. For example, the housing of the cartridge may be manufactured from polypropylene, polyethylene, PEEK, perfluoroalkoxy alkanes (PFA), polytetrafluoroethylene (PTFE), polystyrene, cyclic olefin copolymers, or the like. The surfaces inside the cartridge, such as the walls of the fluid flow path, may be made selectively made from or coated with hydrophobic or hydrophilic materials. The sensor platform can be manufactured from materials suitable for printed circuit boards (PCBs), such as rigid laminated PCB materials including polyimides and epoxies, or flexible materials, such as polyimide, polyethylene terephthalate (PET), and combinations thereof. In one embodiment, the sensor platform is manufactured from high dielectric PCB material available from Rogers Corp. in Chandler, Ariz.

Following fabrication of the BAW resonators and deposition of a SAM over portions thereof (optionally preceded by deposition of a hermeticity layer and an interface layer), the microfluidic channel of the sensing portion may be fabricated by forming one or more walls defining lateral boundaries of the microfluidic channel over the BAW resonators, such that the active region of the BAW resonators is arranged along the bottom surface of the microfluidic passage. The microfluidic passage can then be enclosed using a cap or cover layer that may define fluidic ports (e.g., an inlet and an outlet) enabling fluid communication with the rest of the fluid flow path.

Walls of the microfluidic channels may be formed of any suitable material, such as laser-cut "stencil" layers of thin polymeric materials and/or laminate materials, optionally including one or more self-adhesive surfaces (e.g., adhesive tape). Optionally such walls may be formed prior to deposition of a SAM layer, functionalization material, and/or blocking layers. The walls may be made with a SU-8 negative epoxy resist or other photoresist material. In certain embodiments, a cover or cap layer may be integrally formed with one or more walls (e.g., via molding or another suitable process) to define a portion of an upper boundary as well as lateral boundaries of at least one fluidic channel, and the integrally formed partial cover-and-wall structure may be applied (e.g., adhered or otherwise bonded) over at least a portion of a BAW sensor to enclose the at least one fluidic channel.

In certain embodiments, functionalization (e.g., specific binding) material may be pre-applied to the sensing surface before formation of a microfluidic passage; in other embodiments, functionalization material may be applied over an active region of a bulk acoustic wave resonator structure following formation of the microfluidic passage. The cartridge or parts of the cartridge (such as the sensor platform and BAW die) may be manufactured and/or assembled using low-temperature methods. In some embodiments, the cartridge and its parts are assembled at temperatures below 40° C. The cartridge may be assembled without the use of UV curing, welding, or other process steps that may damage the biomolecules on the sensing surface of the BAW resonators. This allows the biomolecules to be patterned on the sensing surface prior to assembly.

A chemical or biological blocking material may be applied over a portion of a SAM to prevent attachment of a functionalization (e.g., specific binding) material over one or more selected regions of a BAW resonator structure (e.g., one or more regions apart from an active region). The proper choice of a chemical or biological blocking material (e.g., blocking buffer) for a given analysis depends on the type of target species or analyte present in a sample. Various types of blocking buffers such as highly purified proteins, serum, or milk may be used to block free sites on a SAM. Additional blockers include ethanolamine or polyethylene oxide (PEO)—containing materials. An ideal blocking buffer would bind to all potential sites of non-specific interaction away from an active region. To optimize a blocking buffer for a particular analysis, empirical testing may be used to determine signal-to-noise ratio. No single chemical blocking material is ideal for every situation, since each antibody-antigen pair has unique characteristics.

The walls of the fluid flow path may be treated with chemical or biological blocking materials to prevent attachment of analytes in regions other than the BAW sensors. Such blocking materials may be applied ahead of time, or may be provided in one of the solutions used to prime the fluid flow path prior to applying the sample (e.g., a solution or buffer injected through the first fluid port).

According to an embodiment, at least some of the fluid channels of the cartridge may be microfluidic channels. For example, the first and second fluid channels may be microfluidic channels. The distal portion of the fluid flow path may also include microfluidic channels, such as in the mixing region and the sensing portion. The microfluidic channels may have a hydraulic cross-sectional area of about 0.01 $mm^2$ to about 4.0 $mm^2$.

In general, movement of the sample and the analytes contained in the sample in the fluid flow path is primarily affected by hydrophobic/hydrophilic forces or fluid pressure (e.g., fluid from the second fluid port). However, the cartridge may also include other mechanisms to either enhance or retard the movement of certain compounds in the sample. For example, the cartridge may utilize electrophoresis to enhance the sensitivity of the BAW sensor. Examples of such electrophoretic systems are discussed in more detail in co-pending International Patent Application No. PCT/US17/43959, titled MICROFLUIDIC SENSORS USING ELECTROPHORESIS, filed on 26 Jul. 2017, which is incorporated here by reference in its entirety to the extent that it does not conflict with the present disclosure.

The cartridge may include various features for interfacing with the reader. For example, the first and second fluid ports may interface with valves, pumps, or other fluidic interfaces for pneumatic or liquid-based fluid transfer systems on the reader. The cartridge may also include mechanical registrations to position the cartridge within the reader, and interfaces for electrical current (e.g., direct current or alternating current) and power and digital communication signals, magnetic interfaces, thermal interfaces, and/or optical interfaces.

The cartridges of the present disclosure are constructed to receive a liquid sample, to at least temporarily store the sample, to provide sample handling and conditioning, and to transfer and meter the sample to a sensor for analysis of one or more parameters of the sample. Examples of typical samples include biological samples, such as urine, plasma, serum, blood, saliva, tears, sweat, and the like, and environmental samples, such as air or other gases, water, and aqueous solutions.

According to an embodiment and with reference to FIG. 4, the sample is applied to the sample port 20 using any suitable application method. For example, the sample can be applied using a syringe or a pipette or some other applicator. The hydrophilic walls 415 of the sample reservoir 410 at least partially draw the sample into the sample reservoir 410. However, the valve 450, which may be a hydrophobic valve, prevents the sample from advancing past the sample reservoir 410 in the fluid flow path 40.

Once the sample has been applied to the sample port 20, the cartridge 10 may be inserted into the reader to electrically couple the reader with the cartridge 10 through electrical interconnect 13. A fluid interface within the reader may engage the first fluid port 50, injecting a first volume of a first fluid in the first fluid channel 500. The first volume of the first fluid may be from about 100 µL to about 1000 µL. The first fluid may include a buffer or another solution that pre-fills and wets the distal portion 42 of the fluid flow path 40 and opens the hydrophobic valve 450. The first fluid may also include a blocker compound that prevents the sample or the analyte from attaching to the walls of the fluid flow path 40. Injecting the first fluid may also remove any unwanted bubbles in the fluid flow path 40 and stop the sample from getting to the sensor prematurely. The various functions of the first fluid may be understood as "priming" the fluid flow path 40.

A fluid interface within the reader may engage the second fluid port of the cartridge 10 when the cartridge 10 is inserted into the reader. After fluid is moved through the first fluid channel 500 through the first port 50, a second fluid (which may be a liquid or gas) may be injected through the second fluid port 60 to push at least a portion of the sample from the sample reservoir 410 into the sensing portion 440 of the fluid flow path 40. Increased pressure due to the second fluid in the sample reservoir 410 may permit the sample to flow past the valve 450. The sample may mix with a volume of the first fluid in the mixing region 430 of the fluid flow path 40 prior to entering the sensing portion 440. The sample may be mixed with the first fluid to, for example, dilute the sample or to mix the sample with buffering agents or reagents.

In the sensing portion 440 the sample comes into contact with the sensing surface of resonators, and analytes of the sample may selectively bind with biomolecules on the sensing surfaces of the BAW resonators. Multiple analytes can be sensed simultaneously by including, for example, BAW resonators with different biomolecules. In alternative embodiments, the BAW sensor does not include biomolecules and is used to detect physical characteristics of the sample, such as changes in viscosity or density. Signals from the BAW array are received by signal processing and storing units (e.g., control and memory units) on the sensor platform 300 and/or the reader. The reader may to read and optionally interpret the results from the BAW sensor 30, and may deliver results in a desired format, such as display results on a user interface, send results remotely, or produce a print-out.

The volume of the second fluid may be determined by the desired volume of sample that is to be pushed through the sensing portion 440. For example, the volume of the second fluid may be from about 100 µL to about 1000 µL. In one embodiment, the sensing sequence may be interrupted by injecting the first fluid through the first fluid port 50 again before the sample has passed all the way through the sensing portion 440.

The method may further include controlling the temperature of the sample. For example, the sample may be heated to a predetermined temperature using electrically resistive heaters on the sample platform and/or the BAW die.

A further volume of fluid can be injected to drive the sample into the waste reservoir. The method may further include discarding the cartridge after sensing one or more parameters of the sample.

The method can be used to detect various analytes in the sample, or to detect physical characteristics of the sample. For example, the method can be used to detect proteins, DNA, bacteria, fungi, viruses, and other analytes. The sample may be a biological sample, such as urine, plasma, serum, blood, saliva, tears, sweat, or the like, or an environmental sample, such as air or other gas, water, or other aqueous solution.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open-ended sense, and generally mean "including, but not limited to." It will be understood that "consisting essentially of," "consisting of," and the like are subsumed in "comprising" and the like. As used herein, "consisting essentially of," as it relates to a composition, product, method or the like, means that the components of the composition, product, method or the like are limited to the enumerated components and any other components that do not materially affect the basic and novel characteristic(s) of the composition, product, method or the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Any direction referred to herein, such as "top," "bottom," "left," "right," "upper," "lower," and other directions and orientations are described herein for clarity in reference to the figures and are not to be limiting of an actual device or system or use of the device or system. Devices or systems as described herein may be used in a number of directions and orientations.

Those skilled in the art will recognize improvements, variations, and modifications to the exemplary embodiments of the present disclosure. All such improvements and modifications are considered within the scope of the concepts disclosed here and the claims that follow.

The invention claimed is:

1. A cartridge for handling and sensing a sample fluid, the cartridge comprising:
   a sensor comprising a bulk acoustic wave (BAW) resonator having a sensing surface;
   a sample port for introducing the sample fluid into the cartridge;
   a fluid flow path from the sample port to the sensor for carrying the sample fluid introduced into the sample port across the sensing surface of the resonator, the fluid flow path comprising:
   a sample reservoir defining a proximal portion of the fluid flow path and defining an inner surface, the sample reservoir having a proximal end connected to the sample port, a proximal region adjacent the proximal end, a distal end, a distal region adjacent the distal end, and a volume extending between the proximal end and the distal end;
   a sensing portion downstream of the sample reservoir and extending across the sensing surface of the resonator, wherein the sensing surface of the resonator defines at least a portion of a surface of the sensing portion;
   a valve disposed in the distal region of the sample reservoir;
   a first fluid port for introducing a first fluid into the cartridge;
   a first fluid channel having a proximal end connected to the first fluid port and a distal end connected to the distal region of the sample reservoir via the valve, wherein the first fluid channel is in fluid communication with the sensing surface;
   a second fluid port for introducing a second fluid into the cartridge; and
   a second fluid channel having a proximal end connected to the second fluid port and a distal end connected to the proximal region of the sample reservoir,
   wherein the first fluid and the second fluid are the same or different and do not comprise a sample, and wherein the first fluid port and the second fluid port are constructed to couple with an external pump.

2. The cartridge of claim 1, wherein the valve is disposed at the distal end of the sample reservoir.

3. The cartridge of claim 1, wherein the valve comprises a hydrophobic valve.

4. The cartridge of claim 1, wherein the valve comprises a hydrophobic coating of the fluid flow path.

5. The cartridge of claim 1, wherein the sensor comprises a second BAW resonator having a sensing surface, wherein the sensing surface of the second resonator defines at least a portion of the surface of the sensing portion of the flow path.

6. The cartridge of claim 1, wherein the volume of the sample reservoir is from about 1 µL to about 20 µL.

7. The cartridge of claim 1, wherein the sample reservoir volume is defined by walls having a hydrophilic surface.

8. The cartridge of claim 7, wherein the walls comprise a hydrophilic coating.

9. The cartridge of claim 1, wherein the first fluid port and the second fluid port are constructed to couple with an external fluid reservoir.

10. The cartridge of claim 1, wherein the first fluid port and the second fluid port comprise a first valve and a second valve, respectively.

11. The cartridge of claim 1, wherein the fluid flow path comprises a mixing region downstream of the sample reservoir.

12. The cartridge of claim 11, wherein the mixing region comprises one or more static features constructed to induce mixing in the fluid flow path.

13. The cartridge of claim 12, wherein the one or more static features comprise a protrusion narrowing an inside diameter of the fluid flow path.

14. The cartridge of claim 1, wherein the first and second fluid channels are microfluidic channels.

15. The cartridge of claim 1, wherein the sensing portion of the fluid flow path is a microfluidic channel.

16. The cartridge of claim 1, wherein the sample port comprises a closure.

17. A method of sample handling and sensing using a cartridge,
   the cartridge comprising:
   a sample port for introducing a sample fluid into the cartridge, the sample port being connected to a sample reservoir having a proximal end, a proximal region adjacent the proximal end, and a distal end opposite of the proximal end;

a sensor platform comprising a bulk acoustic wave (BAW) resonator and a fluid flow path comprising a sensing region extending across a sensing surface of the BAW resonator; and a fluid valve between the distal end of the sample reservoir and the sensing region, a first fluid port for introducing a first fluid into the cartridge, the first fluid port being connected to a first fluid channel, the first fluid channel being connected to the sample reservoir in the distal region via the fluid valve, and the first fluid channel being in fluid communication with the sensing surface;

a second fluid port for introducing a second fluid into the cartridge, the second fluid port being connected to the sample reservoir in the proximal region via a second fluid channel;

wherein the first fluid and the second fluid are the same or different and do not comprise a sample;

the method comprising:

applying the sample fluid to the sample port;

injecting a first volume of the first fluid through the first fluid port to cause the first fluid to flow across the sensing surface; and then injecting a second volume of the second fluid through the second fluid port to drive the sample fluid into the sensing region of the fluid flow path.

18. The method of claim 17, wherein the first fluid comprises a buffer.

19. The method of claim 17, wherein the second fluid comprises a buffer or a gas.

20. The method of claim 17, wherein the sensing portion of the fluid flow path is a microfluidic channel.

* * * * *